(12) United States Patent
Matsuura

(10) Patent No.: US 9,786,771 B2
(45) Date of Patent: Oct. 10, 2017

(54) SEMICONDUCTOR DEVICE WITH CONTACT GROOVE ARRANGEMENTS PROVIDING IMPROVED PERFORMANCE

(71) Applicant: RENESAS ELECTRONICS CORPORATION, Tokyo (JP)

(72) Inventor: Hitoshi Matsuura, Ibaraki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/171,634

(22) Filed: Jun. 2, 2016

(65) Prior Publication Data

US 2017/0033206 A1 Feb. 2, 2017

(30) Foreign Application Priority Data

Jul. 30, 2015 (JP) .................................. 2015-151267

(51) Int. Cl.
*H01L 29/66* (2006.01)
*H01L 29/739* (2006.01)
*H01L 29/06* (2006.01)
*H01L 29/40* (2006.01)
*H01L 29/10* (2006.01)
*H01L 29/423* (2006.01)

(52) U.S. Cl.
CPC ...... *H01L 29/7397* (2013.01); *H01L 29/0619* (2013.01); *H01L 29/0696* (2013.01); *H01L 29/1095* (2013.01); *H01L 29/404* (2013.01); *H01L 29/407* (2013.01); *H01L 29/4238* (2013.01)

(58) Field of Classification Search
None
See application file for complete search history.

(56) References Cited

U.S. PATENT DOCUMENTS 9,041,050 B2  5/2015 Matsuura
2013/0175574 A1* 7/2013 Matsuura .......... H01L 29/66348
257/139

FOREIGN PATENT DOCUMENTS

JP  2013-140885 A  7/2013

* cited by examiner

*Primary Examiner* — Shaun Campbell
(74) *Attorney, Agent, or Firm* — McDermott Will & Emery LLP

(57) ABSTRACT

The performance of a semiconductor device is improved. An emitter electrode is coupled to a P-type body region and an N$^+$-type emitter region of a linear active cell region via a contact groove formed on an interlayer insulating film and is coupled to a P-type body region of a linear hole connector cell region via a contact groove. The contact grooves arranged in the linear hole connector cell region are shorter than the contact groove in plan view.

15 Claims, 12 Drawing Sheets

SEMICONDUCTOR DEVICE WITH CONTACT GROOVE ARRANGEMENTS PROVIDING IMPROVED PERFORMANCE

CROSS-REFERENCE TO RELATED APPLICATIONS

The disclosure of Japanese Patent Application No. 2015-151267 filed on Jul. 30, 2015 including the specification, drawings and abstract is incorporated herein by reference in its entirety.

The present invention relates to a semiconductor device and is properly usable for, for example, power semiconductor devices such as an injection enhancement (IE) trench gate insulated gate bipolar transistor (IGBT) including active cells and inactive cells in a direction orthogonal to a trench gate.

BACKGROUND

For example, Japanese Unexamined Patent Application Publication No. 2013-140885 discloses an IE trench gate IGBT in which a cell forming region basically includes a first linear unit cell region having a linear active cell region, a second linear unit cell region having a linear hole connector cell region, and a linear inactive cell region between these regions.

SUMMARY

For example, in the IE trench gate IGBT described in Japanese Unexamined Patent Application Publication No. 2013-140885, trench gate electrodes on both sides of the linear hole connector cell region are coupled to emitter electrodes. Thus, the thinning rate of active cells is kept in a proper range so as to sufficiently obtain an IE effect while avoiding an increase in gate capacitance, achieving a cell shrink.

However, unlike an IE trench gate IGBT having a linear active cell region instead of a linear hole connector cell region, the provision of the linear hole connector cell region reduces an accumulated carrier concentration. Unfortunately, this may increase an on voltage and deteriorate performance.

Other problems and new features will become apparent from a description and the accompanying drawings of the specification.

A semiconductor device according to an embodiment is configured such that an emitter electrode is coupled to a P-type body region and an $N^+$-type emitter region of a linear active cell region via a first contact groove formed on an interlayer insulating film and is coupled to a P-type body region of a linear hole connector cell region via a second contact groove. The second contact grooves arranged in the linear hole connector cell region are shorter than the first contact groove in plan view.

The performance of the semiconductor device can be improved according to the embodiment.

DETAILED DESCRIPTION

Figure 1:
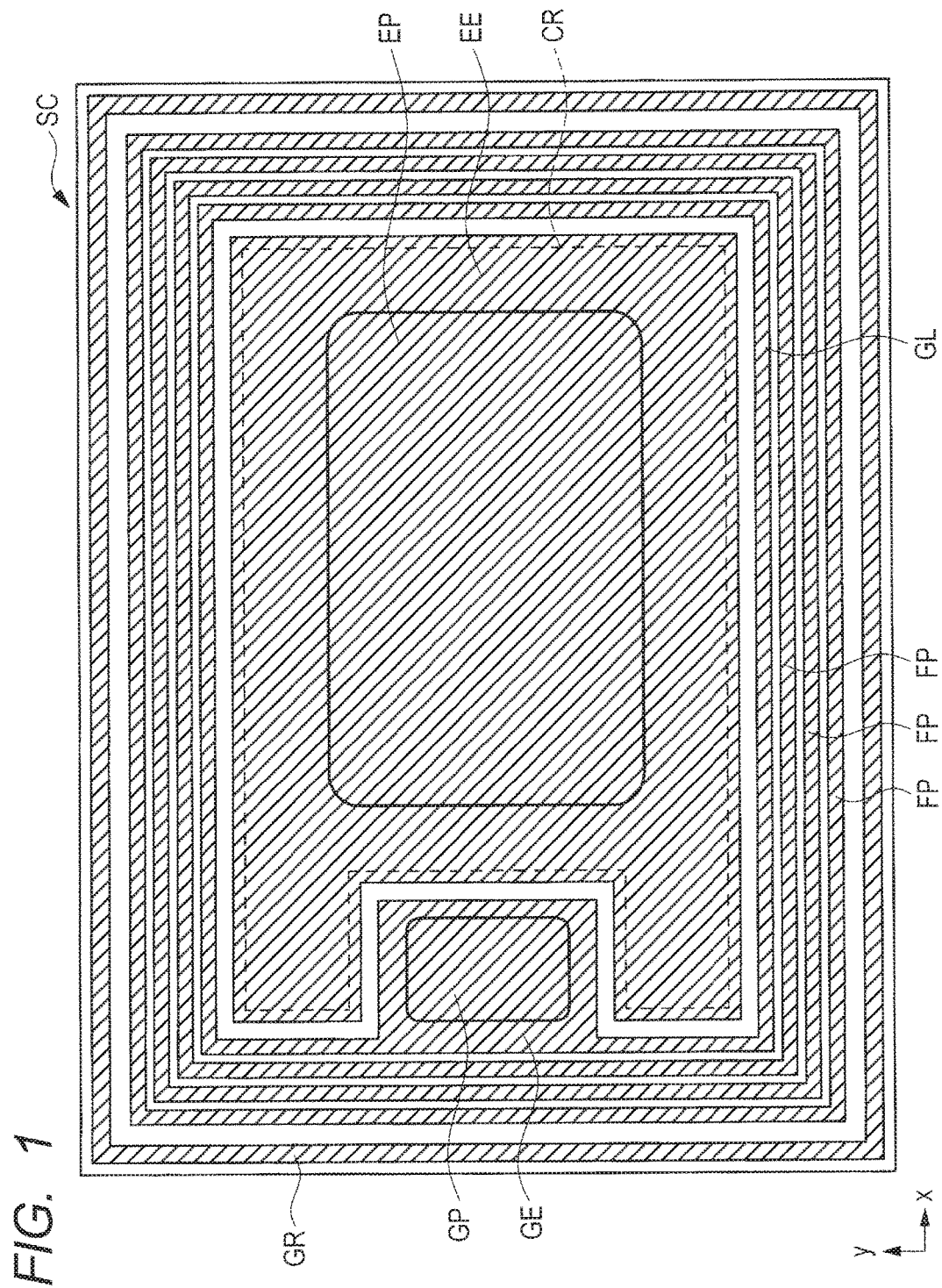
FIG. 1 is a plan view showing a principal part of a semiconductor chip in a semiconductor device according to an embodiment.

An embodiment described below may be optionally divided into multiple sections or embodiments while being related to one another unless otherwise specified. For example, one section or embodiment may be a modification, a detailed description, or a supplementary explanation of at least some of other sections or embodiments.

In the following embodiment, the number of elements (e.g., the number of elements, a numeric value, an amount, and a range) is not limited to a specific number unless otherwise specified or theoretically limited to a definite specific number. Thus, the number of elements may be equal to or smaller or larger than the specific number.

Needless to say, the constituent elements (including element steps) of the following embodiment are not always necessary unless otherwise specified or definitely required in principle.

Moreover, it is needless to say that "comprised of A", "made up of A", "having A", and "including A" do not exclude other elements unless only A is specified. Similarly, in the following embodiment, the shapes or positional relationships of constituent elements substantially include close or similar shapes unless otherwise specified or clearly distinguished from one another. The numeric value and range are also similarly defined.

The drawings used in the following embodiment may be hatched to improve visibility also in plan view. In all the drawings of the following embodiment, the constituent elements having the same function are fundamentally indicated by the same reference numerals and the repeated explanation thereof is omitted. The present embodiment will be specifically described below in accordance with the accompanying drawings.

Embodiment

Structure of IE Trench Gate IGBT

Figure 2:
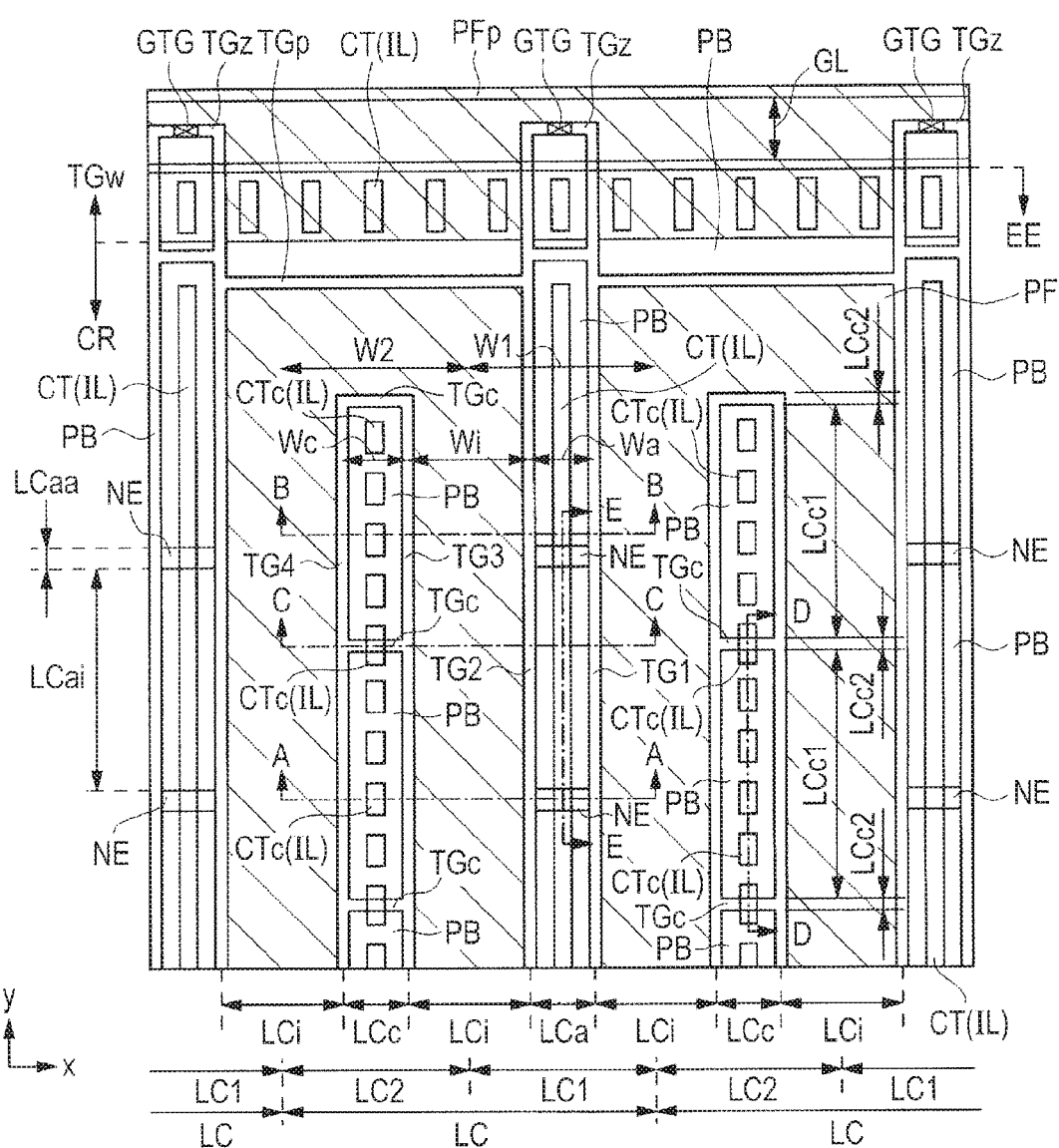
FIG. 2 is an enlarged plan view showing a principal part of the semiconductor chip, that is, an active part of the semiconductor chip according to the embodiment.
Figure 3:
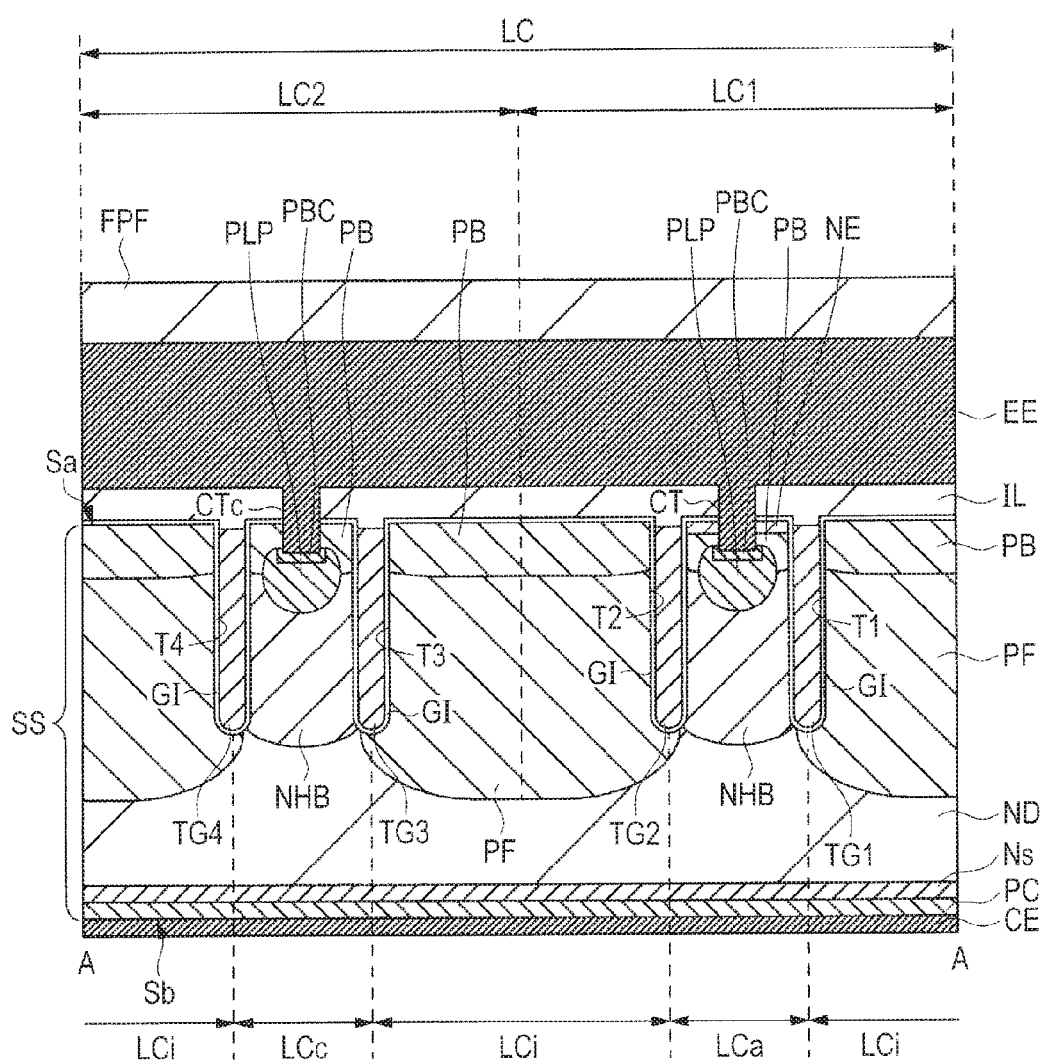
FIG. 3 is a cross sectional view showing the principal part taken along line A-A of FIG. 2.
Figure 4:
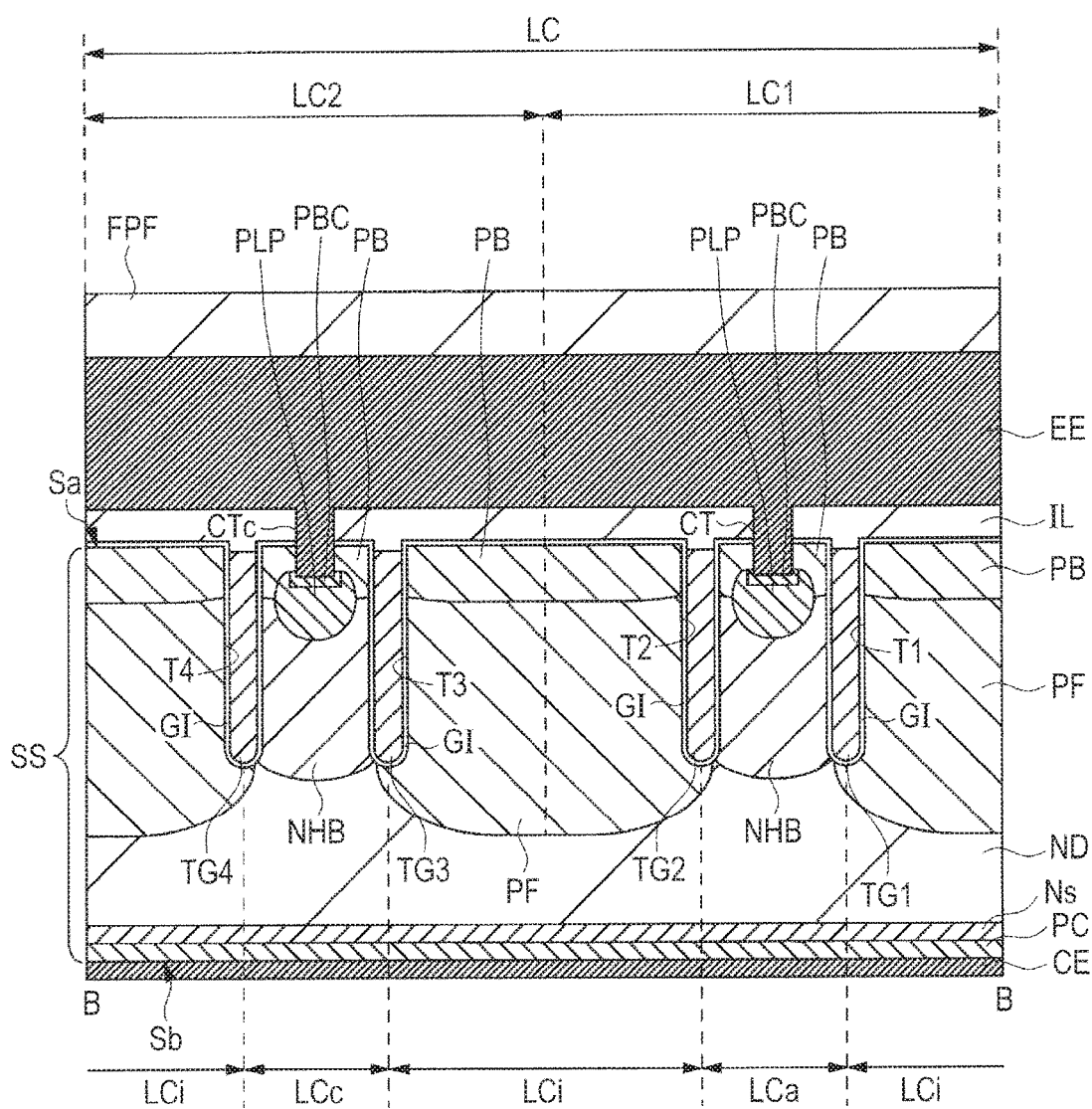
FIG. 4 is a cross sectional view showing the principal part taken along line B-B of FIG. 2.
Figure 5:
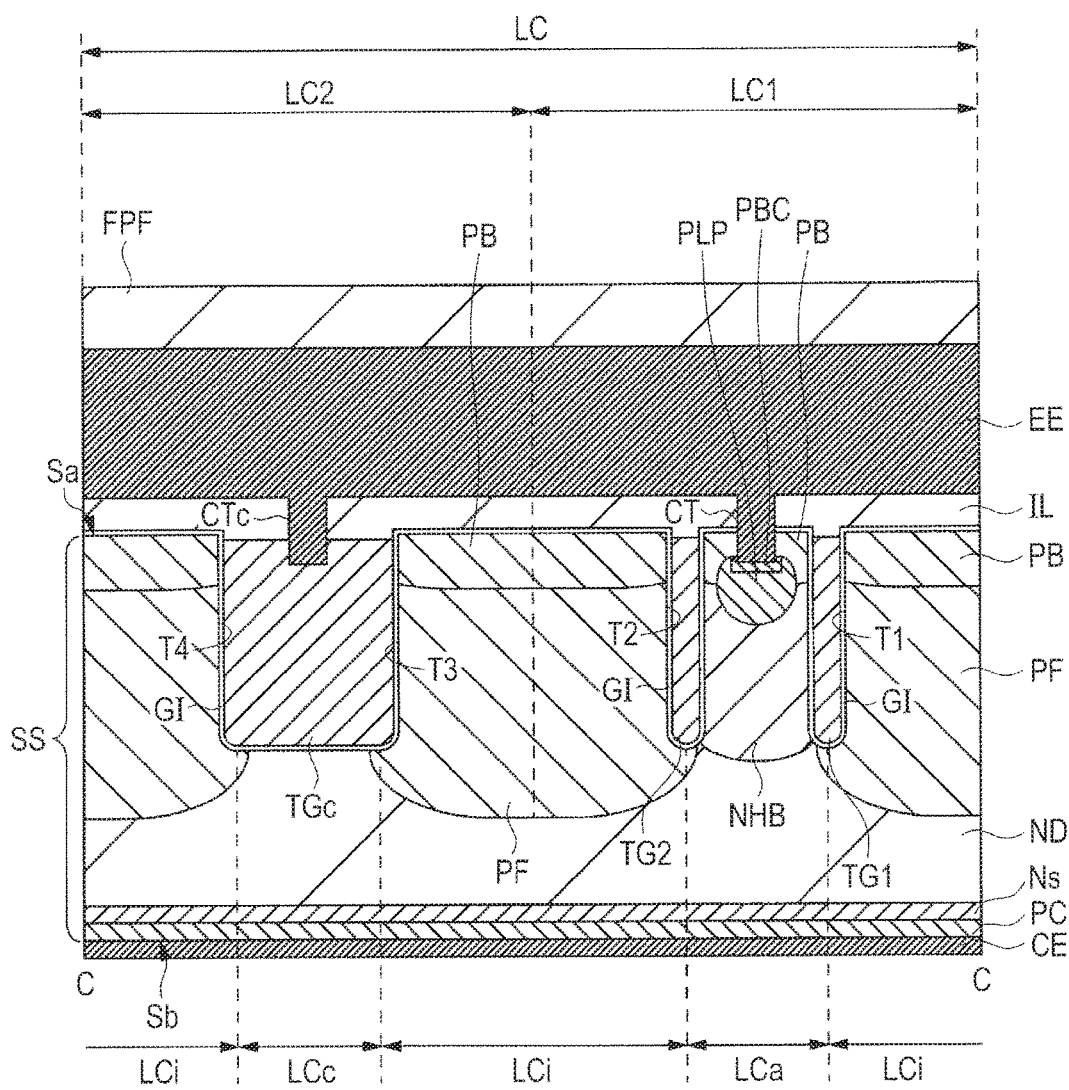
FIG. 5 is a cross sectional view showing the principal part taken along line C-C of FIG. 2.
Figure 6:
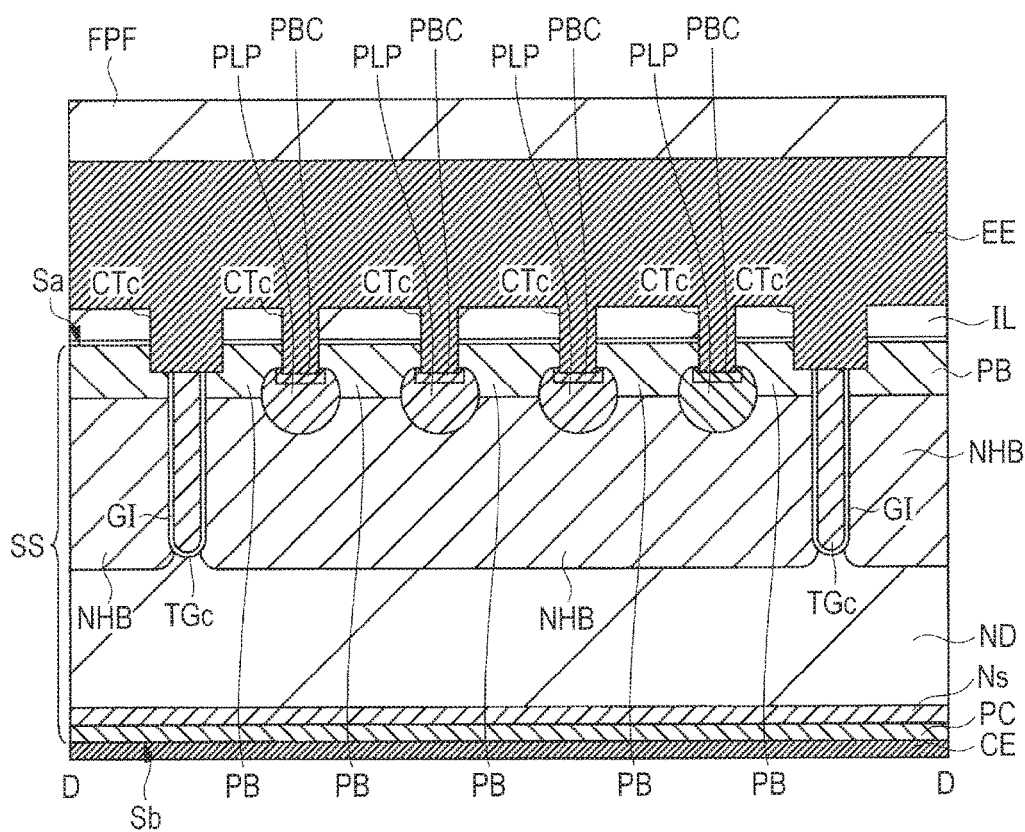
FIG. 6 is a cross sectional view showing the principal part taken along line C-C of FIG. 2.
Figure 7:
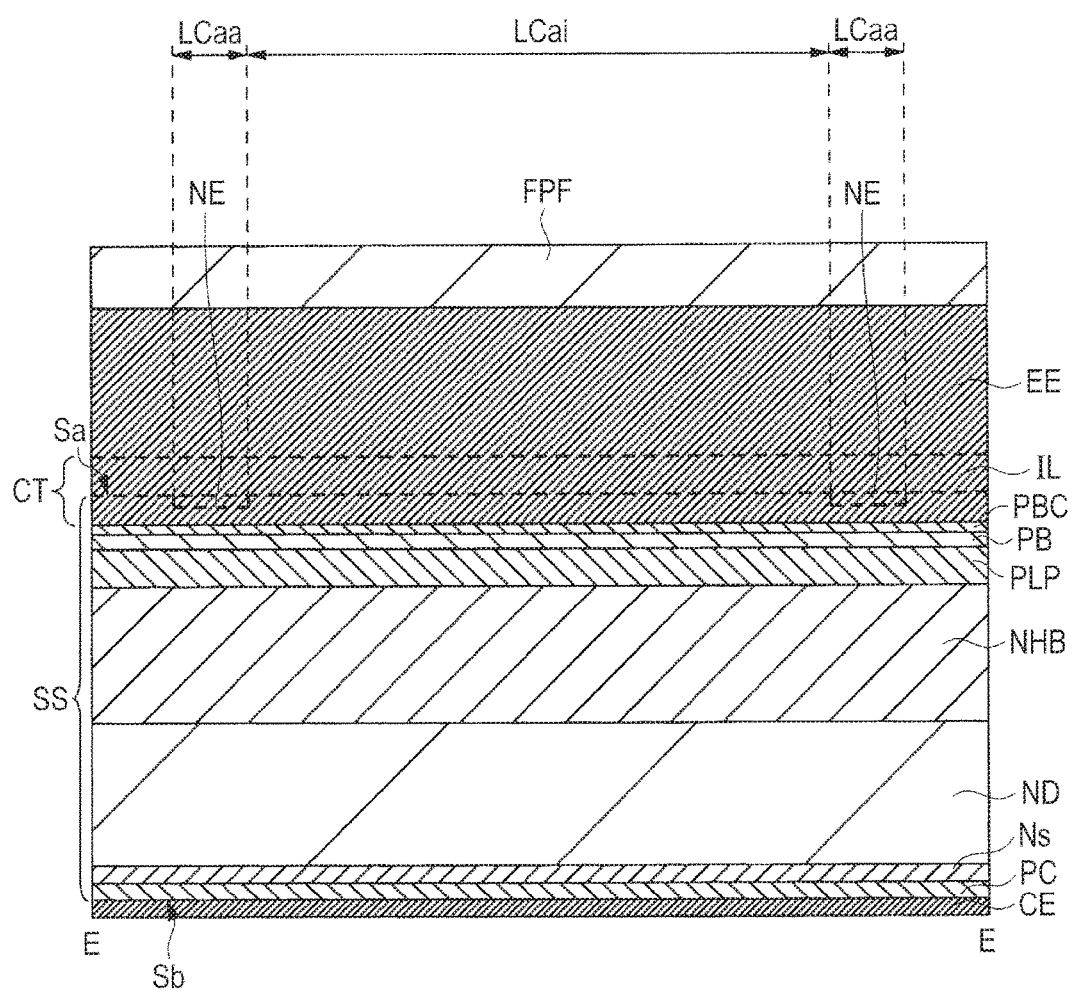
FIG. 7 is a cross sectional view showing the principal part taken along line E-E of FIG. 2.

Referring to FIGS. 1 to 7, a semiconductor device including an IE trench gate IGBT according to the present embodiment will be described below. FIG. 1 is a plan view showing a principal part of a semiconductor chip that forms the IE trench gate IGBT according to the present embodiment. FIG. 2 is an enlarged plan view showing a principal part of the semiconductor chip, that is, an active part of the semiconductor chip according, to the present embodiment. FIGS. 3 to 7 are cross sectional views showing a principal part of the IE trench gate IGBT according to the present embodiment. FIG. 3 is a cross sectional view showing the principal part taken along line A-A of FIG. 2. FIG. 4 is a cross sectional view showing the principal part taken along line B-B of FIG. 2. FIG. 5 is a cross sectional view showing the principal part taken along line C-C of FIG. 2. FIG. 6 is a cross sectional view showing the principal part taken along line D-D of FIG. 2. FIG. 7 is a cross sectional view showing the principal part taken along line E-E of FIG. 2. The IE trench gate IGBT according to the present embodiment has a withstand voltage of, for example, about 600 V.

As shown in FIG. 1, an annular guard ring GR is provided on the top surface of the outer edge of a semiconductor chip SC, and several (at least one) annular field plates FP are provided inside the annular guard ring GR so as to be coupled to an annular floating field ring or the like. The guard ring GR and the field plate FP each include a metal film primarily composed of, for example, aluminum.

A cell forming region CR is provided inside the annular field plates FP and on the principal part of the active part of the semiconductor chip SC, and an emitter electrode EE is provided on the top surface of the active part of the semiconductor chip SC so as to extend near the outer edge of the semiconductor chip SC. The emitter electrode EE includes a metal film primarily composed of, for example, aluminum. The central part of the emitter electrode EE serves as an emitter pad EP for coupling, for example, bonding wires.

A gaze wire GL is arranged between the emitter electrode EE and the field plate FP and is coupled to a gate electrode GE. The gate wire GL is arranged around the emitter electrode EE. The gate wire GL and the gate electrode GE each include a metal film primarily composed of, for example, aluminum. The central part of the gate electrode GE serves as a gate pad GP for coupling, for example, bonding wires.

As shown in FIG. 2, in the cell forming region CR, linear unit cell regions LC are periodically arranged in x direction. The linear unit cell region LC includes a first linear unit cell region LC1 and a second linear unit cell region LC2. In the present embodiment, a width W1 of the first linear unit cell region LC1 and a width W2 of the second linear unit cell region LC2 are identical or substantially equal to each other. The first linear unit cell region LC1 and the second linear unit cell region LC2 are continuously extended from the top side to the bottom side of the cell forming region CR in, for example, y direction of FIG. 1. The first linear unit cell region LC1 and the second linear unit cell region LC2 may be continuously extended from the left side to the right side of the cell forming region CR along x direction of FIG. 1.

The first linear unit cell region LC1 includes a central linear active cell region LCa and a pair of half-width linear inactive cell regions LCi that surround the linear active cell region LCa. A first linear trench gate electrode (gate electrode) TG1 or a second linear trench gate electrode (gate electrode) TG2 that is electrically coupled to the gate electrode (the gate electrode GE in FIG. 1) is provided between the linear active cell region LCa and the linear inactive cell region LCi.

The second linear unit cell region LC2 includes a central linear hole connector cell region LCc and a pair of half-width linear inactive cell regions LCi that surround the linear hole connector cell region LCc. A third linear trench gate electrode (gate electrode) TG3 or a fourth linear trench gate electrode (gate electrode) TG4 that is electrically coupled to the emitter electrode EE is provided between the linear hole connector cell region LCc and the linear inactive cell region LCi. The first linear trench gate electrode (gate electrode) TG1, the second linear trench gate electrode (gate electrode) TG2, the third linear trench gate electrode (gate electrode) TG3, and the fourth linear trench gate electrode (gate electrode) TG4 are equal in width in x direction.

A width Wa of the linear active cell region LCa and a width Wc of the linear hole connector cell region LCc are smaller than a width Wi of the linear inactive cell region LCi. The IE trench gate IGBT according to the present embodiment is a so-called "narrow active cell unit cell".

Furthermore, the linear active cell regions LCa or the linear hole connector cell regions LCc and the linear inactive cell regions LC1 are alternatively arranged so as to include the linear unit cell region LC. The IE trench gate IGBT according to the present embodiment is a so-called "alternate arrangement".

The boundary between the first linear unit cell region LC1 and the second linear unit cell region LC2 is located at the center of the linear inactive cell region LCi interposed between the linear active cell region LCa and the linear hole connector cell region LCc. The width Wa of the linear active cell region LCa is set from the center of the first linear trench gate electrode TG1 to the center of the second linear trench gate electrode TG2. The width Wc of the linear hole connector cell region LCc is set from the center of the third linear trench gate electrode TG3 to the center of the fourth linear trench gate electrode TG4. The width Wi of the linear inactive cell region. LCi is set from the center of the second linear trench gate electrode TG2 to the center of the third linear trench gate electrode TG3.

In the linear active cell region LCa, a contact groove CT formed on an interlayer insulating film IL is arranged at the center of the linear active cell region LCa along y direction longitudinal direction) perpendicular to x direction and the emitter electrode EE is coupled to a P-type body region PB and an N$^+$-type emitter region NE.

In the linear active cell region LCa, a region having the N$^+$-type emitter region NE, that is, an active section LCaa and a region not having the N$^+$-type emitter region NE (P-type body region PB), that is, an inactive section LCai are alternatively provided periodically in y direction (longitudinal direction).

The contact groove CT includes a linear slit having a desired width and is continuously extended from one end to the other end of the linear active cell region LCa in y direction. In other words, the contact groove CT is continuously formed over the active sections LCaa and the inactive sections LCai. Furthermore, the contact groove CT is continuously extended over the adjacent two N$^+$-type emitter regions NE and the inactive section LCai interposed between the emitter regions NE.

In the linear hole connector cell region LCc, coupling trench gate electrodes TGc are periodically provided in y direction (longitudinal direction) so as to couple the third linear trench gate electrode TG3 and the fourth linear trench gate electrode TG4. The coupling trench gate electrodes TGc are extended in x direction. The coupling trench gate electrodes TGc are also provided on both ends of the linear hole connector cell region LCc in y direction. The placement region of the coupling trench gate electrode TGc is called a coupling section (coupling part) LCc2. Moreover, a region between the adjacent coupling trench gate electrodes TGc is called a feeding section (feeding part) LCc1.

In the linear hole connector cell region LCc, a plurality of contact grooves (contact openings) CTc are periodically formed in y direction (longitudinal direction). The contact grooves CTc are rectangular or circular.

The contact grooves CTc intersect the coupling trench gate electrodes TGc except for both ends of the linear hole connector cell region LCc. The top of the coupling trench gate electrode TGc is exposed at the intersection. In other words, the third linear trench gate electrode TG3 and the fourth linear trench gate electrode TG4 are electrically coupled to the emitter electrode EE via the coupling trench gate electrode TGc.

In the feeding section LCc1, the contact grooves CTc are periodically arranged in y direction (longitudinal direction) and the lower end (bottom) of the feeding section LCc1 reaches a P-type body contact region PBC formed on a semiconductor substrate. In the contact grooves CTc, the P-type body contact region PBC and the P-type body region PB are electrically coupled to the emitter electrode EE.

In the present embodiment, the width Wc of the linear hole connector cell region LCc and the width Wa of the linear active cell region LCa are identical or substantially equal to each other, which is not always required. However, the identical or substantially equal widths advantageously realize a uniform hole distribution.

The linear inactive cell region LCi has a P-type floating region PF. In the present embodiment, the P-type floating region PF is deeper than the lower end of a trench where the first, second, third, and fourth linear trench gate electrodes TG1, TG2, TG3, and TG4 are formed, and the P-type floating region PF covers the lower end of the trench. Such a structure is not always necessary but advantageously keeps a withstand voltage with ease even if the width Wi of the linear inactive cell region LCi in x direction is larger than the width Wa of the linear active cell region LCa in x direction. In the present embodiment, the width Wa of the linear active cell region LCa in x direction is smaller than the width Wi of the linear inactive cell region LCi in x direction. This structure is not always necessary but can improve an IE effect.

The cell forming region CR is partially surrounded by, for example, the P-type body region PB that is electrically coupled to the emitter electrode EE via the contact groove CT. The contact grooves CTc formed in the linear hole connector cell region LCc are equal in length to or shorter in y direction than the contact grooves CT formed in the P-type body region PB.

The cell forming region CR is surrounded by, for example, the gate wire GL. The first linear trench gate electrode TG1 and the second linear trench gate electrode TG2 are extended from the inside of the cell forming region CR toward the gate wire GL. Furthermore, in the extended part of the first linear trench gate electrode TG1 and the second linear trench gate electrode TG2 (that is, a gate drawing part TGw), an end coupling trench gate electrode TGz is electrically coupled to the gate wire GL via a gate wire trench gate electrode coupling part GTG. The linear inactive cell region LCi and the outer edge of the cell forming region CR are divided by an end trench gate electrode TGp.

Referring to FIG. 3, a cross sectional structure taken along line A-A of FIG. 2 will be discussed below.

As shown in FIG. 3, a semiconductor substrate SS is primarily composed of an N-type drift region ND. A back side (second principal surface, undersurface) Sb of the semiconductor substrate SS has an N-type field stop region Ns and a P$^+$-type collector region PC that are sequentially provided from the N-type drift region ND. Furthermore, the back side Sb of the semiconductor substrate SS has a collector electrode CE that is electrically coupled to the P$^+$-type collector region PC. The semiconductor substrate SS is composed of an N$^-$-type silicon single crystal.

A surface (first principal surface, top surface) Sa of the semiconductor substrate SS is substantially covered with a P-type body region PB (substantially over the cell forming region CR).

At the boundaries between the linear active cell region LCa and the linear inactive cell regions LCi, the surface Sa of the semiconductor substrate SS has a first trench T1 and a second trench T2 that contain the first linear trench gate electrode TG1 and the second linear trench gate electrode TG2, respectively, via a gate insulating film GI.

The first linear trench gate electrode TG1 and the second linear trench gate electrode TG2 are electrically coupled to the gate electrode (the gate electrode GE in FIG. 1). The first linear trench gate electrode TG1 is embedded from the lower end to the top of the first trench T1 formed in the semiconductor substrate SS. Similarly, the second linear trench gate electrode TG2 is embedded from the lower end to the top of the second trench T2 formed in the semiconductor substrate SS.

At the boundaries between the linear hole connector cell region LCc and the linear inactive cell regions LCi, the surface Sa of the semiconductor substrate SS has a third trench T3 and a fourth trench T4 that contain the third linear trench gate electrode TG3 and the fourth linear trench gate electrode TG4, respectively, via the gate insulating film GI.

The third linear trench gate electrode TG3 and the fourth linear trench gate electrode TG4 are electrically coupled to the emitter electrode EE. Moreover, the third linear trench gate electrode TG3 is embedded from the lower end to the top of the third trench T3 formed in the semiconductor substrate SS. Similarly, the fourth linear trench gate electrode TG4 is embedded from the lower end to the top of the fourth trench T4 formed in the semiconductor substrate SS.

In the linear active cell region LCa, the surface Sa of the semiconductor substrate SS has the N$^+$-type emitter region NE and the P-type body contact region PBC is provided on the lower end of the contact groove CT. A P$^+$-type latchup preventing region PLP is provided under the P-type body contact region PBC. An N-type hole barrier region NHB is provided under the P$^+$-type latchup preventing region PLP. In other words, the N$^+$-type emitter region NE, the P-type body contact region PBC, the P$^+$-type latchup preventing region PLP, and the P-type body region PB are coupled to the emitter electrode EE.

An impurity dope structure in the linear hole connector cell region LCc is identical to the linear active cell region LCa except for the absence of the N$^+$-type emitter region NE.

In the linear inactive cell region LCi, the surface Sa of the semiconductor substrate SS has the P-type floating region PF that is deeper than, for example, the first, second, third, and fourth trenches T1, T2, T3, and T4 under the P-type body region PB.

As shown in FIG. 3, in the present embodiment, the linear hole connector cell region LCc includes the N-type hole barrier region NHB and the P$^+$-type latchup preventing region PLP, which are not always necessary, like the linear active cell region LCa. However, the provision of the N-type hole barrier region NHB and the P$^+$-type latchup preventing region PLP can keep the balance of an overall hole flow.

The interlayer insulating film IL made of, for example, silicon oxide is formed substantially over the surface Sa of the semiconductor substrate SS. The emitter electrode EE including a metal film primarily composed of, for example, aluminum is provided on the interlayer insulating film IL. In the linear active cell region LCa, the emitter electrode EE is coupled to the N+-type emitter region NE, the P-type body region PB, the P+-type latchup preventing region PLP, and the P-type body contact region PBC via the contact groove CT. In the linear hole connector cell region LCc, the emitter electrode EE is electrically coupled to the P-type body region PB, the P+-type latchup preventing region PLP, and the P-type body contact region PBC via the contact groove CTc.

A final passivation film FPF including, for example, an organic insulating film composed of polyimide is formed on the emitter electrode EE.

The first linear trench gate electrode TG1, the second linear trench gate electrode TG2, the third linear trench gate electrode TG3, and the fourth linear trench gate electrode TG4 are each composed of, for example, a polycrystalline silicon film containing an N-type impurity.

The interlayer insulating film IL may be, for example, a phophsilicate glass (PSG) film, a borophosphsilicate glass (BPSG) film, a non-doped silicate glass (NSG) film, a spin-on-glass (SOG) film, or a composite membrane thereof.

The emitter electrode EE may have a laminated structure of a TiW film serving as a barrier metal film and an aluminum metal film (doped with, for example, several percent of silicon and aluminum) on the barrier metal film.

Referring to FIG. 4, a cross sectional structure taken along line B-B of FIG. 2 will be described below.

As shown in FIG. 4, the linear active cell region LCa does not include the N+-type emitter region NE in cross section and thus the linear active cell region LCa and the linear hole connector cell region LCc are identical in FIG. 4. Other structures are identical to those of FIG. 3. Needless to say, as in FIG. 3, the first linear trench gate electrode TG1 and the second linear trench gate electrode TG2 are electrically coupled to the gate electrode (the gate electrode GE shown in FIG. 1) while the third linear trench gate electrode TG3 and the fourth linear trench gate electrode TG4 are electrically coupled to the emitter electrode EE.

Referring to FIG. 5, a cross sectional structure taken along line C-C of FIG. 2 will be described below.

As shown in FIG. 5, structures other than the linear hole connector cell region LCc are identical to those of FIG. 4. The linear hole connector cell region LCc is substantially composed only of the coupling trench gate electrode TGc. Specifically, the contact groove CTc formed on the interlayer insulating film IL exposes the top surface (surface) of the coupling trench gate electrode TGc, and the emitter electrode EE formed in the contact groove CTc is electrically coupled to the coupling trench gate electrode TGc.

Referring to FIG. 5, a cross sectional structure taken along line D-D of FIG. 2 will be described below. FIG. 6 is a cross sectional view taken along the extending direction of the linear hole connector cell region LCc.

As shown in FIG. 6, between the adjacent two coupling trench gate electrodes TGc, the P-type body region PB and the N-type hole barrier region NHB are sequentially formed from the surface Sa of the semiconductor substrate SS in y direction. Between the adjacent two coupling trench gate electrodes TGc, the contact grooves CTc are formed on the interlayer insulating film IL so as to extend inward from the surface Sa of the semiconductor substrate SS. At the bottom of the contact groove CTc, the P-type body contact region PBC and the P+-type latchup preventing region PLP are formed in the semiconductor substrate SS. Moreover, the emitter electrode EE formed in the contact groove CTc is in contact with the P-type body region PB and the P-type body contact region PBC. In other words, as shown in FIG. 3, the emitter electrode BE is electrically coupled to the P-type body region PB, the P+-type latchup preventing region PLP, and the P-type body contact region PBC via the contact groove CTc.

The contact groove CTc is formed on the interlayer insulating film IL so as to expose the top of the coupling trench gate electrode TGc, and the emitter electrode EE formed in the contact groove CTc is in contact with the coupling trench gate electrode TGc. In other words, the emitter electrode EE is electrically coupled to the coupling trench gate electrode TGc via the contact groove CTc.

Referring to FIG. 7, a cross sectional structure taken along line E-E of FIG. 2 will be described below. FIG. 7 is a cross sectional view taken along the extending direction of the linear active cell region LCa.

In FIG. 7, the surface Sa of the semiconductor substrate SS, the N+-type emitter region NE, and the interlayer insulating film IL are indicated by broken lines to facilitate understanding. The emitter electrode EE is formed on the interlayer insulating film IL and in the slit-like contact groove CT formed on the interlayer insulating film IL and is in contact with the P-type body contact region PBC. The slit-like contact groove CT is continuously extended over the inactive section LCai and the active sections LCaa located on both ends of the inactive section LCai.

The present embodiment specifically described the IE trench gate IGBT having the "narrow active cell unit cell." Needless to say, the present invention is not limited to this configuration and is also applicable to an IE trench gate IGBT having a "non-narrow active cell unit cell."

Moreover, the present embodiment specifically described the IE trench gate IGBT having the "alternate arrangement." Needless to say, the present invention is not limited to this configuration and is also applicable to an IE trench gate IGBT having a "non-alternate arrangement."

In order to more specifically illustrate the structure of the IE trench gate IGBT an example of the main dimensions of the parts of the IE trench gate IGBT (FIGS. 1 to 7) will be discussed below.

The width Wa of the linear active cell region LCa is about 1.3 μm and the width Wi of the linear inactive cell region LCi is about 3.3 μm. In this case, the width Wa of the linear active cell region LCa is desirably smaller than the width Wi of the linear inactive cell region LCi and the values of Wi/Wa are particularly preferable at, for example, 2 to 3.

The contact grooves CT and CTc are about 0.3 μm in width. The contact groove CT formed in the linear active cell region LCa is at least 10 μm in length (y direction). The contact groove CTc formed in the linear hole connector cell region LCc is about 0.3 to 1 μm in length (y direction). The first, second, third, and fourth trenches T1, T2, T3, and T4 are about 0.7 μm (0.8 μm or less is particularly preferable) in width and are about 3 μm in depth. The N+-type emitter region NE from the surface Sa of the semiconductor substrate SS has a depth of about 0.25 μm, the P-type body region PB (channel region) has a depth of about 0.8 μm, the P+-type latchup preventing region PLP has a depth of about 1.4 μm, and the P-type floating region PF has a depth of about 4.5 μm. The N-type field stop region Ns from the back side Sb of the semiconductor substrate SS has a depth of about 2.0 μm, and the P+-type collector region PC has a depth of about 0.5 μm.

The semiconductor substrate SS has a thickness of about 70 μm (in this example, a withstand voltage of about 600 V). The thickness of the semiconductor substrate SS considerably depends on a required withstand voltage. Thus, a withstand voltage of 1200 V is equivalent to, for example, about 120 μm and a withstand voltage of 400 V is equivalent to, for example, about 40 μm.

Also in the following example, the corresponding parts have substantially the same dimensions and thus the explanation thereof is not repeated.

A Feature of the Semiconductor Device According to the Present Embodiment

The emitter electrode EE is coupled to the linear hole connector cell region LCc via the contact grooves CTc, thereby reducing the on voltage of the semiconductor device. Some holes injected from the $P^+$-type collector region PC to the N-type drift region ND are discharged from the linear hole connector cell region LCc to the emitter electrode EE. The contact grooves CTc, which are not long slits but holes spaced at predetermined intervals, adds the resistance of the P-type body region PB to a hole discharging path so as to increase a hole discharging resistance. This configuration reduces holes discharged through the linear hole connector cell region LCc and thus accelerates accumulation of holes in the N-type drift region ND. This can accelerate the conductivity modulation of the N-type drift region ND and reduce an on voltage. In other words, the performance of the IE trench gate IGBT can be improved.

Figure 8:
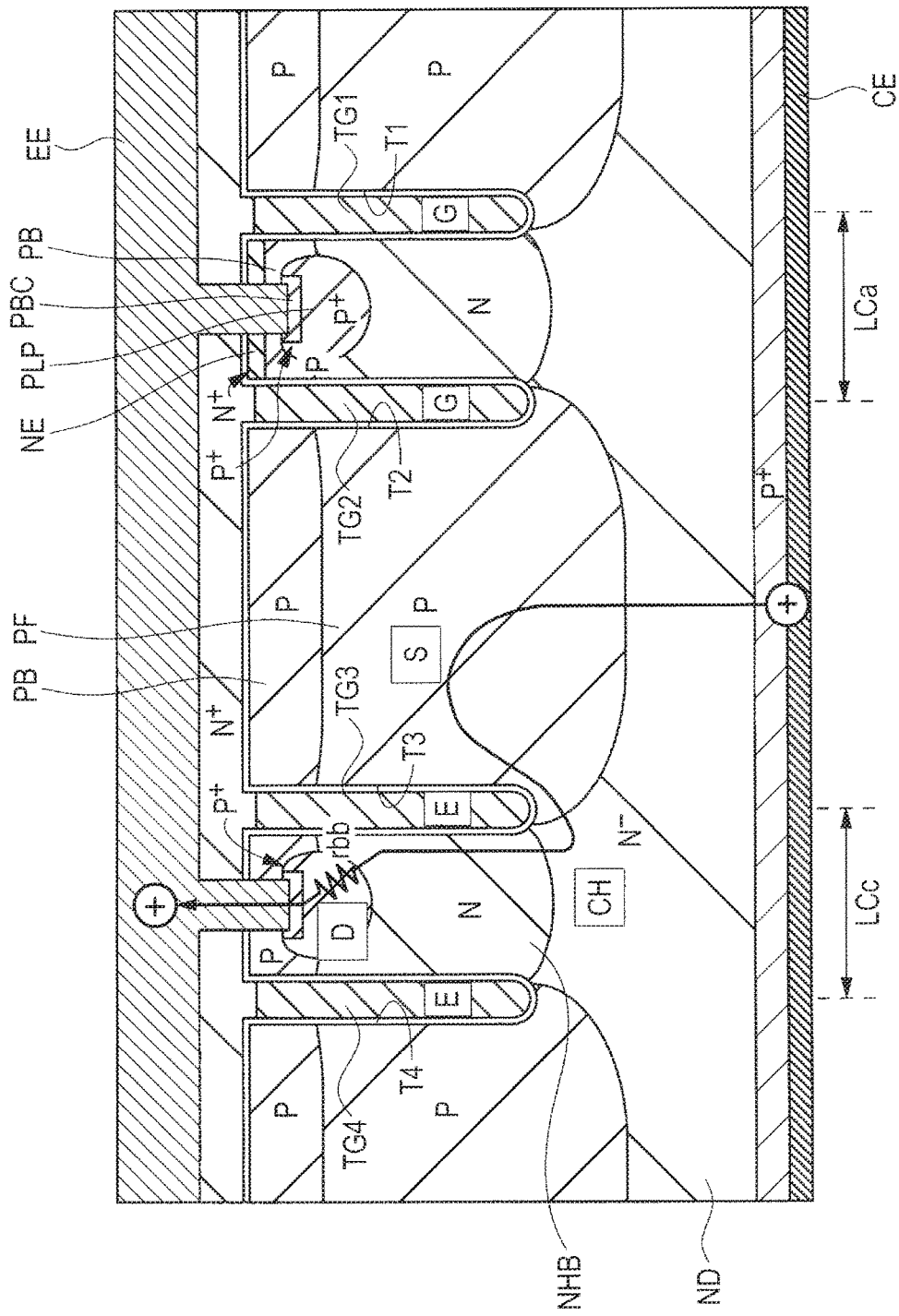
FIG. 8 is a principal part cross sectional view for explaining the effect of the embodiment.

Referring to FIG. 8, this point will be discussed below. FIG. 8 is a principal part cross sectional view for explaining the effect of the present embodiment. In the following explanation, a resistance rbb is almost 0, that is, the contact grooves are continuous long slits like the contact grooves CT of the linear active cell region LCa. As shown in FIG. 8, a parasitic PMOS transistor is formed in the IE trench gate IGBT. Specifically, the parasitic PMOS transistor is formed with the P-type floating region PF serving as source "S", the N-type drift region ND and the N-type hole barrier region NHB serving as channel "CH", the $P^+$-type latchup preventing region PLP, the P-type body contact region PBC, and the P-type body region PB serving as drain "D", the trench gate electrodes TG3 and TG4 formed as gates "E" on both sides of the linear hole connector cell region LCc. The trench gate electrodes TG3 and TG4 formed on both sides of the linear hole connector cell region LCc are denoted as gates E, whereas the trench gate electrodes TG1 and TG2 formed on both sides of the linear active cell region LCa are denoted as gates "G" to make a distinction.

In the IE trench gate IGBT, when holes are injected into the P-type floating region PF, the source "S" of the parasitic PMOS transistor increases in potential, generating a negative potential difference between the gate "E" and the source "S" of the parasitic PMOS transistor. Thus, the parasitic PMOS transistor is turned on and the holes injected into the P-type floating region PF are discharged to the drain "D" of a parasitic MOSFET.

A feature of the present invention is that holes injected into the P-type floating region PF are discharged from the P-type floating region PF so as not to excessively leave holes in the P-type floating region PF in a transient state during a switching operation. This can suppress uncontrollable potential fluctuations in the P-type floating region PF in a transient state, achieving low noise. However, enhanced hole discharge means that the IE trench gate IGBT has a high on voltage.

Thus, as shown in FIGS. 2 and 6, the contact grooves CTc for coupling the emitter electrode EE are holes spaced at the predetermined intervals. As shown in FIG. 8, this adds the resistance rbb of the P-type body region PB to the hole discharging path so as to increase a hole discharging resistance. In the present embodiment, the hole discharge resistance of the linear hole connector cell region LCc is reduced so as to improve the performance of the IE trench gate IGBT.

In this configuration, the contact grooves CTc are formed for the linear hole connector cell region LCc linearly extended in the cell forming region CR. Furthermore, the contact grooves CTc are formed between the adjacent coupling trench gates TGc in the linear hole connector cell region LCc. The contact grooves CTc between the adjacent coupling trench gates TGc are identical in size and are spaced at equal intervals.

Moreover, as described above, the contact groove CT formed in the linear active cell region LCa is preferably shaped like a long slit in order to fix the P-type body region PB of the linear active cell region LCa at the potential of the emitter electrode EE.

Figure 9:
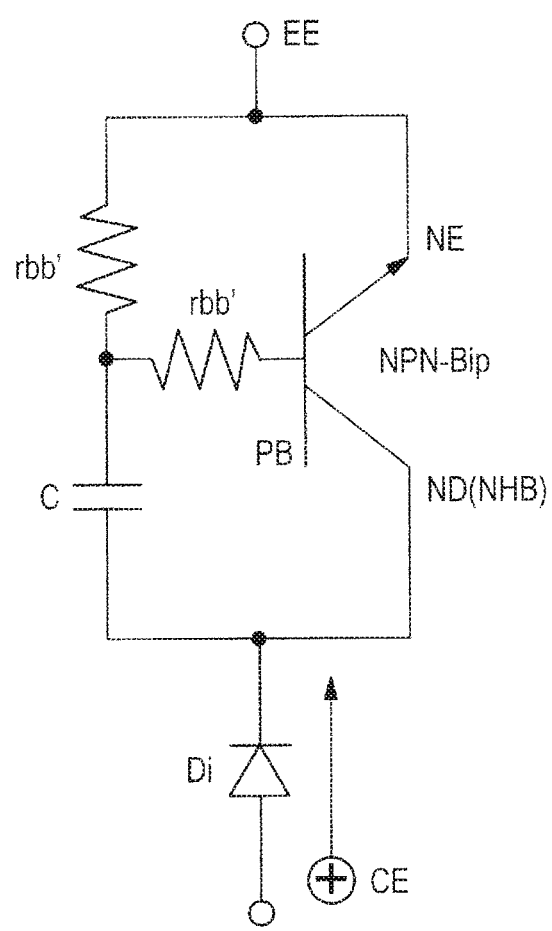
FIG. 9 is an equivalent circuit diagram showing a part (linear active cell region) of the semiconductor device according to the embodiment.

FIG. 9 is an equivalent circuit diagram showing a part (linear active cell region LCa) of the semiconductor device according to the present embodiment. In the part of the $N^+$-type emitter region NE of the linear active cell region LCa, as shown in FIG. 9, a parasitic bipolar transistor is formed with the N-type drift region ND serving as a collector, the P-type body region PB serving as a base, and the $N^+$-type emitter region NE serving as an emitter. In FIG. 9, a diode Di includes a $P^+$-type collector region PC and an N-type drift region ND, a capacitor C is a PN-junction depletion-layer capacitance between the P-type body region PB and the N-type hole barrier region NHB, and rbb' denotes the resistance of the P-type body region PB.

For example, the contact groove CT for coupling the emitter electrode EE to the P-type body region PB and the $N^+$-type emitter region NE is shaped like a short circle or an oval instead of a long slit, increasing the resistance rbb of the P-type body region PB. Thus, the injection of holes from the $P^+$-type collector region PC turns on the NPN parasitic bipolar transistor and passes a large current between the collector electrode CE and the emitter electrode EE. This may cause thermal breakdown of the IE trench gate IGBT.

Thus, the contact groove CT formed in the linear active cell region LCa preferably has a maximum area. For example, the contact groove CT is preferably formed continuously over the active sections LCaa and the inactive sections LCai and is continuously extended from one end to the other end of the linear active cell region LCa.

In other words, the contact groove CT formed in the linear active cell region LCa is preferably longer than the contact groove CTc formed in the linear hole connector cell region LCc in y direction.

First Modification

Figure 10:
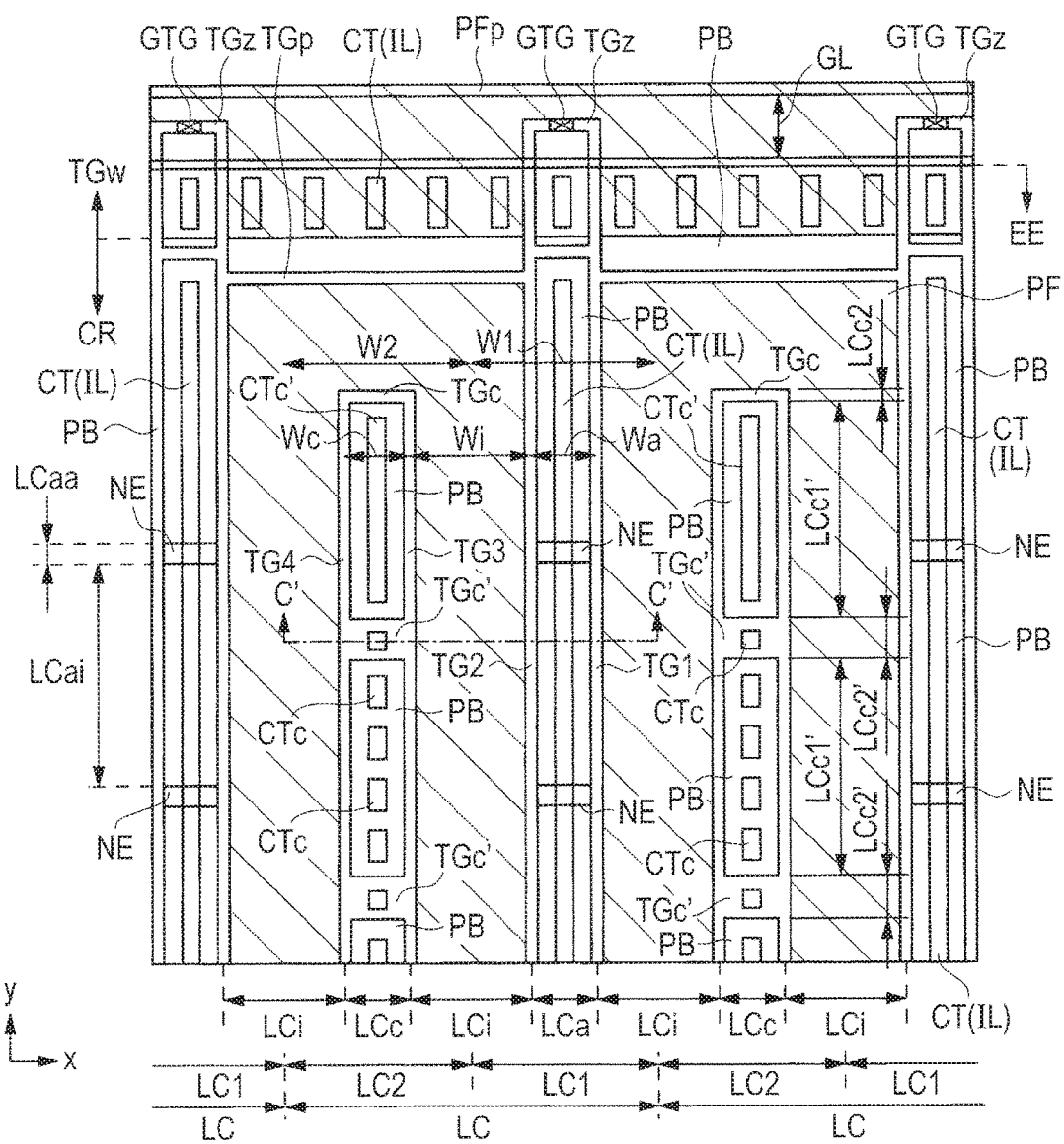
FIG. 10 is a plan view showing a modification of FIG. 2.

FIG. 10 is a plan view showing a modification of FIG. 2. In the first modification, a single contact groove CTc' that brings the emitter electrode EE into contact with the P-type body region PB is provided on one end of the linear hole connector cell region LCc extended in y direction. Moreover, a single contact groove (not shown in FIG. 10) that brings the emitter electrode EE into contact with the P-type body region PB is provided on the other end of the linear hole connector cell region LCc extended in y direction.

As shown in FIG. 10, the emitter electrode EE is in contact with the P-type body region PB through the contact groove CTc' in y direction in a feeding section LCc1' located on the distal end of the linear hole connector cell region LCc. In another feeding section LCc1' located inside the feeding section LCc1' on the distal end, the emitter electrode EE is in contact with the P-type body region PB through the contact grooves CTc.

The contact groove CTc' of the feeding section LCc1' on the distal end (y direction) is longer than the total length of the contact grooves CTc provided in the feeding section LCc1' located inside the distal end feeding section LCc1'. As a matter of course, the length of the contact groove CTc' of the feeding section LCc1' on the distal end (y direction) is longer than the contact groove CTc provided in the feeding section LCc1' located inside the distal end feeding section LCc1'.

The feeding section LCc1' on the distal end of the linear hole connector cell region LCc is located on the outer periphery (end) of the semiconductor chip SC, and the feeding section LCc1' located inside the distal end feeding section LCc1' is arranged at the center of the semiconductor chip SC.

Specifically, this configuration can increase the on voltage of the linear active cell region LCa near the outer edge of the semiconductor chip SC and reduce the on voltage of the linear active cell region LCa near the center of the semiconductor chip SC, thereby increasing a breakdown voltage caused by heat generation on the outer edge of the semiconductor chip SC.

Needless to say, the contact groove CTc' of the distal end feeding section LCc1' (y direction) is shorter than the contact groove CT formed in the linear active cell region LCa.

In FIG. 10, the structure of a coupling trench gate electrode TGc' in a coupling section LCc2' is different from that of the foregoing embodiment except for the coupling trench gate electrodes TGc on both ends of the linear hole connector cell region LCc in y direction. Specifically, the coupling trench gate electrode TGc' in the coupling section LCc2' has no trenches between the third linear trench gate electrode TG3 and the fourth linear trench gate electrode TG4.

Figure 11:
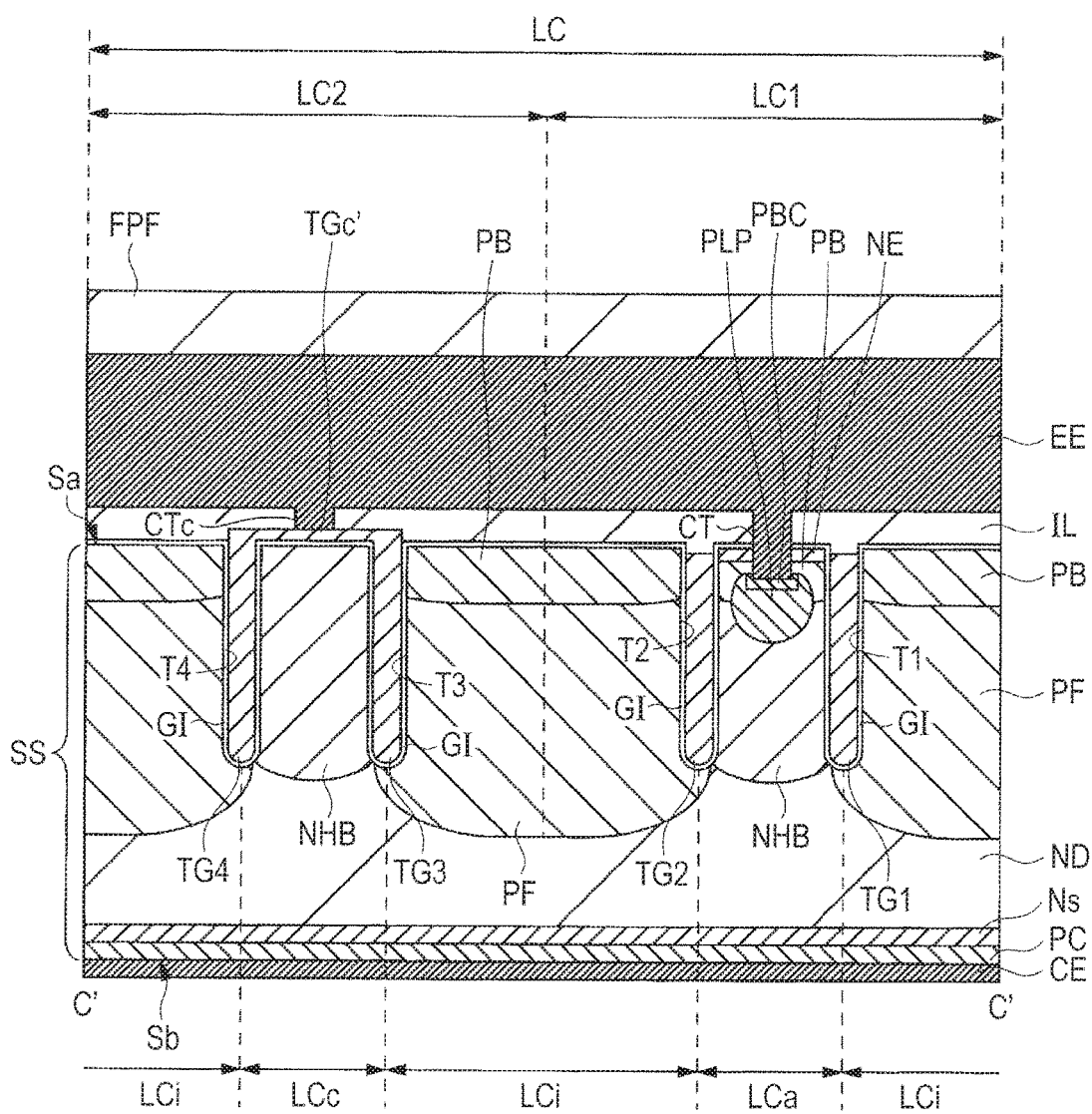
FIG. 11 is a principal part cross sectional view taken along line C'-C' of FIG. 10.

FIG. 11 is a principal part cross sectional view taken along line C'-C' of FIG. 10. The coupling trench gate electrode TGc' formed on the surface Sa of the semiconductor substrate SS so as to couple the third linear trench gate electrode TG3 and the fourth linear trench gate electrode TG4. In other words, the third linear trench gate electrode TG3 and the fourth linear trench gate electrode TG4 are electrically coupled to the emitter electrode EE via the coupling trench gate electrode TGc'.

The structure for coupling the third linear trench gate electrode TG3 and the fourth linear trench gate electrode TG4 via the coupling trench gate electrode TGc' is also applicable to the foregoing embodiment.

Second Modification

Figure 12:
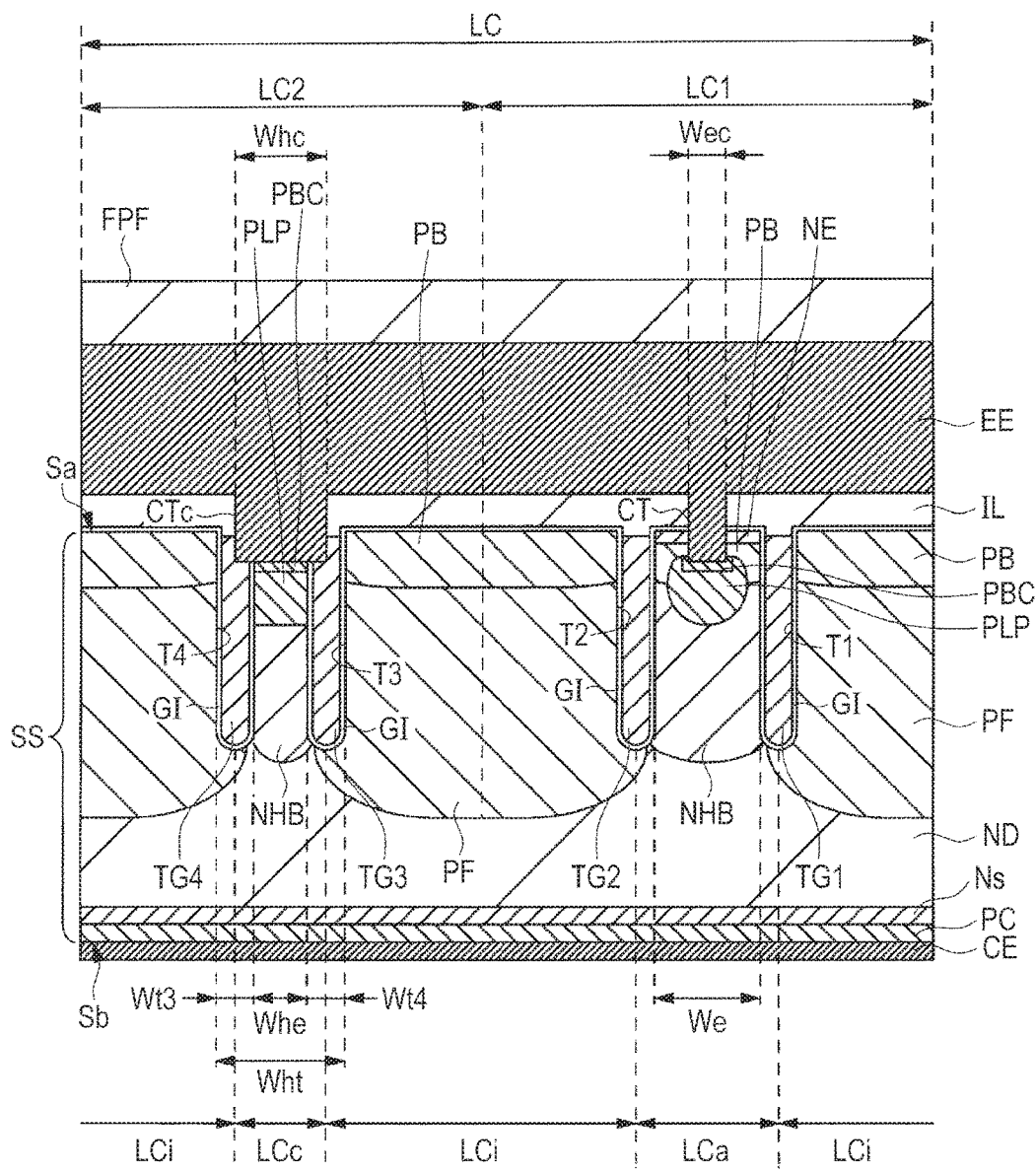
FIG. 12 is a principal part cross sectional view showing a modification of FIG. 3.

FIG. 12 is a principal part cross sectional view showing a modification of FIG. 3. A second modification is different from the foregoing embodiment in that the linear hole connector cell region LCc is narrower than the linear active cell region LCa.

An IE trench gate IGBT according to the second modification is different from the IE trench gate IGBT of the foregoing embodiment in the structure of the linear hole connector cell region LCc. Thus, only different parts from the IE trench gate IGBT of the foregoing embodiment will be basically described below.

In the second embodiment, as shown in FIG. 12, a distance Whe between the third trench T3 and the fourth trench T4 of the linear hole connector cell region LCc is smaller than a distance We between the first trench T1 and the second trench T2 of the linear active cell region LCa.

Specifically, the linear hole connector cell region LCc only needs the function of discharging holes injected into the P-type floating region PF. Thus, the distance Whe between the third trench T3 and the fourth trench T4 of the linear hole connector cell region LCc can be smaller than the distance We between the first trench T1 and the second trench T2 of the linear active cell region LCa (Whe>We).

Since the distance Whe between the third trench T3 and the fourth trench T4 of the linear hole connector cell region LCc is reduced, holes injected to the P-type floating region PF are less likely to be discharged. This accumulates holes in the N-type drift region ND so as to increase a carrier concentration, thereby advantageously reducing an on voltage.

The shapes and layout of the contact grooves CTc in the second modification are similar to those of the foregoing embodiment. Thus, a hole discharging resistance can be larger than that of the foregoing embodiment, thereby further reducing the on voltage.

The second modification can be combined with the first modification.

As shown in FIG. 12, the contact groove CTc of the linear hole connector cell region LCc is formed such that a width Whc of the contact groove CT in the linear hole connector cell region LCc is larger than a width Wec of the contact groove CT in the linear active cell region LCa (Whc>Wec). Alternatively, the width Whc of the contact groove CTc in the linear hole connector cell region LCc may be smaller than a total width Wht of the distance Whe between the third trench T3 and the fourth trench T4, a width Wt3 of the third trench T3, and a width Wt4 of the fourth trench TA and larger than the distance Whe between the third trench T3 and the fourth trench T4 ((Whe+Wt3+Wt4)>Whc>Whe).

In other words, the contact groove CTc of the linear hole connector cell region LCc may be formed on the third trench T3 and the fourth trench T4. However, the contact groove CTc of the linear hole connector cell region LCc is not formed over the third trench T3 and the fourth trench T4 onto the P-type floating region PF (P-type body region PB). This configuration prevents electrical coupling between the emitter electrode EE and the P-type floating region PF so as to avoid an emitter potential in the P-type floating region PF.

FETs need to be vertically formed near the first trench T1 and the second trench T2 of the linear active cell region LCa, requiring a stable and accurate impurity concentration in the P-type body region PB. Thus, a certain distance is necessary from the side walls of the first and second trenches T1 and T2 to the P$^+$-type latchup preventing region PLP that is formed by ion injection after the contact groove CT of the linear active cell region LCa is opened. A specific allowance depends on the processing technique of a manufacturing process and factory management. The allowance needs to be set on the assumption that the width Wec of the contact groove CT may be too large in the linear active cell region LCa or the contact groove CT of the linear active cell region LCa may be displaced from the first trench T1 and the second trench T2 in lithography.

Near the third trench T3 and the fourth trench T4 of the linear hole connector cell region LCc, the FETs are not vertically formed. This eliminates the need for the N$^+$-type emitter region NE and an allowance between the P'-type latchup preventing region PLP and the side walls of the third and fourth trenches T3 and T4.

The invention made by the inventors was specifically described according to the embodiment. The present invention is not limited to the embodiment and may be changed in various ways without departing from the scope of the invention.

What is claimed is:

1. A semiconductor device comprising:
a semiconductor substrate having a first major surface and a second major surface opposite to the first major surface;
a first electrode formed over the second major surface;
a first semiconductor region formed with a first conductivity type in contact with the first electrode, near the second major surface of the semiconductor substrate;
a second semiconductor region formed with a second conductivity type different from the first conductivity type, over the first semiconductor region;
a first gate electrode and a second gate electrode that are formed from the first major surface toward the second major surface and are extended along a first direction of the first major surface in plan view;
a third semiconductor region formed with the first conductivity type between the first gate electrode and the second gate electrode;
a fourth semiconductor region formed with the second conductivity type over the third semiconductor region;
a third gate electrode and a fourth gate electrode that are formed from the first major surface toward the second major surface and are extended along the first direction in plan view;
a fifth semiconductor region formed with the first conductivity type between the third gate electrode and the fourth gate electrode and extended along the first direction;
an interlayer insulating film covering the first major surface; and
a second electrode that is formed over the interlayer insulating film, is coupled to the third semiconductor region and the fourth semiconductor region via a first contact groove formed over the interlayer insulating film, and is coupled to a continuous portion of the fifth semiconductor region via a plurality of second contact grooves formed over the interlayer insulating film.

2. The semiconductor device according to claim 1, wherein the second contact grooves are shorter than the first contact groove in the first direction.

3. The semiconductor device according to claim 1, further comprising a first coupling part and a second coupling part that couple the third gate electrode and the fourth gate electrode and are arranged next to each other in the first direction,
wherein the second contact grooves are arranged between the first coupling part and the second coupling part.

4. The semiconductor device according to claim 1,
wherein the third semiconductor region is continuous in the first direction,
wherein the fourth semiconductor region includes two portions spaced apart in the first direction, and
wherein the third semiconductor region is arranged between the two portions of the fourth semiconductor region and is coupled to the second electrode via the first contact groove.

5. The semiconductor device according to claim 4,
wherein the first contact groove extends over the adjacent fourth semiconductor regions in the first direction.

6. The semiconductor device according to claim 1,
wherein the third gate electrode is adjacent to the second gate electrode, and
wherein the semiconductor device further includes a sixth semiconductor region that is arranged with the first conductivity type between the second gate electrode and the third gate electrode so as to be deeper than the second gate electrode and the third gate electrode.

7. The semiconductor device according to claim 1,
wherein the third gate electrode and the fourth gate electrode are coupled to the second electrode.

8. The semiconductor device according to claim 1,
wherein a distance between the third gate electrode and the fourth gate electrode is smaller than a distance between the first gate electrode and the second gate electrode.

9. A semiconductor device comprising:
a semiconductor substrate having a first major surface and a second major surface opposite to the first major surface;
a first electrode formed over the second major surface;
a first semiconductor region formed with a first conductivity type in contact with the first electrode, near the second major surface of the semiconductor substrate;
a second semiconductor region formed with a second conductivity type different from the first conductivity type, over the first semiconductor region;
a first gate electrode and a second gate electrode that are formed from the first major surface toward the second major surface and are extended along a first direction of the first major surface in plan view;
a third semiconductor region formed with the first conductivity type between the first gate electrode and the second gate electrode;
a fourth semiconductor region formed with the second conductivity type over the third semiconductor region;
a third gate electrode and a fourth gate electrode that are formed from the first major surface toward the second major surface and are extended along the first direction of the first major surface in plan view;
a first coupling part, a second coupling part, and a third coupling part that are extended in a second direction intersecting the first direction and couple the third gate electrode and the fourth gate electrode;
a fifth semiconductor region formed with the first conductivity type between the first coupling part and the second coupling part and a sixth semiconductor region formed with the first conductivity type between the second coupling part and the third coupling part, between the third gate electrode and the fourth gate electrode,
an interlayer insulating film covering the first major surface; and
a second electrode that is formed over the interlayer insulating film, is coupled to the fifth semiconductor region via a first contact groove formed over the interlayer insulating film, and is coupled to the sixth semiconductor region via a second contact groove formed over the interlayer insulating film,
wherein the first contact groove is longer than the second contact groove in the first direction.

10. The semiconductor device according to claim 9,
wherein the sixth semiconductor region is coupled to the second electrode via the second contact groove and another second contact groove.

11. The semiconductor device according to claim 9,
wherein the second electrode is coupled to the third semiconductor region and the fourth semiconductor region via a third contact groove formed over the interlayer insulating film.

12. The semiconductor device according to claim 11, wherein the third contact groove is longer than the first contact groove in the first direction.

13. The semiconductor device according to claim 9, further comprising a third electrode arranged around the second electrode on the first major surface,
   wherein the first coupling part is closer to the third electrode than the second coupling part and the third coupling part.

14. The semiconductor device according to claim 13, wherein the first gate electrode and the second gate electrode are coupled to the third electrode.

15. The semiconductor device according to claim 9, wherein the third gate electrode and the fourth gate electrode are coupled to the second electrode.

* * * * *